United States Patent
Lim et al.

(10) Patent No.: US 7,528,042 B2
(45) Date of Patent: May 5, 2009

(54) METHOD FOR FABRICATING SEMICONDUCTOR DEVICES HAVING DUAL GATE OXIDE LAYER

(75) Inventors: Kwan-Yong Lim, Kyoungki-do (KR);
Heung-Jae Cho, Kyoungki-do (KR);
Dae-Gyu Park, Kyoungki-do (KR);
Tae-Ho Cha, Kyoungki-do (KR);
In-Seok Yeo, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 275 days.

(21) Appl. No.: 11/477,090

(22) Filed: Jun. 28, 2006

(65) Prior Publication Data

US 2006/0246669 A1    Nov. 2, 2006

Related U.S. Application Data

(62) Division of application No. 10/292,296, filed on Nov. 12, 2002, now Pat. No. 7,157,339.

(30) Foreign Application Priority Data

Nov. 29, 2001    (KR)    ............... 2001-75118

(51) Int. Cl.
*H01L 21/336*    (2006.01)
(52) U.S. Cl. ............... 438/279; 257/E21.489; 257/E21.675
(58) Field of Classification Search ........... 438/279, 438/197, 216, 275, 287, 792; 257/E21.489, 257/E21.675
See application file for complete search history.

(56) References Cited

U.S. PATENT DOCUMENTS

| 5,480,828 A | 1/1996 | Hsu et al. ............ 437/56 |
|---|---|---|
| 5,672,521 A | 9/1997 | Barsan et al. ............ 437/24 |
| 5,712,208 A | 1/1998 | Tseng et al. ............ 438/770 |
| 6,033,998 A | 3/2000 | Aronowitz et al. ............ 438/786 |
| 6,136,654 A | 10/2000 | Kraft et al. ............ 438/287 |

(Continued)

FOREIGN PATENT DOCUMENTS

JP    10-173187    6/1998

(Continued)

OTHER PUBLICATIONS

Peter J. Wright et al., The Effect of Fluorine in Silicon Dioxide Gate Dielectrics, IEEE Transactions on Electron Devices, vol. 36, No. 5, May 1989, pp. 879-889.

(Continued)

*Primary Examiner*—Khiem D Nguyen
(74) *Attorney, Agent, or Firm*—Marshall, Gerstein & Borun LLP

(57) ABSTRACT

A method for forming a dual gate oxide layer, including the steps of: a) forming a gate oxide layer on a semiconductor substrate; and b) increasing a thickness of a part of the gate oxide layer by performing a decoupled plasma treatment. Additional heat processes are not necessary because the dual gate oxide layer is formed with the decoupled plasma. Also, the channel characteristic of the semiconductor device can be ensured because the silicon substrate is not damaged. Furthermore, because the threshold voltage in the cell region is increased without additional channel ion implantation, the electrical characteristic of the semiconductor device can be enhanced.

4 Claims, 5 Drawing Sheets

U.S. PATENT DOCUMENTS

| | | | | |
|---|---|---|---|---|
| 6,165,849 | A | 12/2000 | An et al. | 438/275 |
| 6,265,327 | B1 | 7/2001 | Kobayashi et al. | 438/776 |
| 6,426,305 | B1 | 7/2002 | Chou et al. | |
| 6,503,846 | B1 * | 1/2003 | Niimi et al. | 438/776 |
| 6,528,434 | B2 * | 3/2003 | Chen | 438/787 |
| 6,548,366 | B2 | 4/2003 | Niimi et al. | 438/384 |
| 6,686,298 | B1 | 2/2004 | Beaman et al. | 438/775 |
| 7,323,370 | B2 * | 1/2008 | Furukawa | 438/151 |

FOREIGN PATENT DOCUMENTS

TW         426941         3/2001

OTHER PUBLICATIONS

Terence B. Hook et al., "The Effects of Fluorine on Parametrics and Reliability in a 0.18-μm 3.5/6.8 nm Dual Gate Oxide CMOS Technology," IEEE Transactions on Electron Devices, vol. 48, No. 7, Jul. 2001, pp. 1346-1353.

Shareef et al., "Plasma Nitridation of Very Thin Gate Dielectrics," Microelectronic Eng., vol. 59, Issues 1-4, Nov. 2001, 1 page.

Lek et al. "Effects of Post-Decoupled-Plasma-Nitridation Annealing of Ultra-Thin Gate Oxide", Proceedings of $9^{th}$ IPFA 2002, pp. 232-236.

Ozaki et al., "An Ultra Thin Nitrided Oxide Gate Dielectric Formation by Using Slot Plane Antenna Plasma", 2003 IEEE/SEMI, pp. 137-141.

Official Notification of the Intellectual Property Office dated Apr. 14, 2004, with translation, 6 pages.

Notice of Preliminary Rejection from Korean Intellectual Property Office dated May 31, 2004 with translation, 3 pages.

Preliminary Notice of Rejeciton of the IPO dated May 17, 2005, with translation, 29 pages.

May 26, 2005, Reporting letter from client explaining relevance of TW426941 for which no English abstract is available, 5 pages.

* cited by examiner

METHOD FOR FABRICATING SEMICONDUCTOR DEVICES HAVING DUAL GATE OXIDE LAYER

CROSS REFERENCE TO RELATED APPLICATION

This is a divisional of U.S. Ser. No. 10/292,296 filed Nov. 12, 2002, now issued as U.S. Pat. No. 7,157,339, the entire disclosure of which is incorporated herein by reference.

BACKGROUND

1. Technical Field

Methods for forming dual gate oxide layers, and more particularly, methods for fabricating semiconductor device having dual gate oxide layers are disclosed.

2. Description of the Related Art

Generally, a silicon dioxide $SiO_2$ layer, which is grown by a thermal process, is used for a gate oxide layer. In general tendency of the semiconductor device design, the thickness of the gate oxide layer is below the range of 25x to 30x, which is the maximum tunneling limit of the $SiO_2$ layer.

However, a threshold voltage Vt in the cell is higher than the threshold voltage Vt in the peripheral circuit, because of the refresh. Therefore, a high gate voltage needs to be applied to the cell transistor so that the electrical characteristic is not deteriorated.

To enhance the characteristic of the cell transistor, a dual gate oxide formation method needs to be applied to the cell transistor in order to increase the thickness of the gate oxide layer.

Among the several techniques for forming the dual gate oxide layer, two methods are widely used. One of them is a method for forming the dual gate oxide layer by eliminating the gate oxide layer in some part, then oxidizing and forming the dual gate oxide layer again. Another method includes forming the dual gate oxide layer by ion implanting nitrogen in some part in order to idle the growth of the gate oxide layer.

However, the first method has a problem that a semiconductor substrate is damaged because the high heat process is applied twice to the semiconductor in order to form the dual gate oxide layer. The second method has a similar problem that the semiconductor substrate is damaged by ion implanting nitrogen.

Especially if the semiconductor substrate is damaged, deterioration of the channel mobility results.

SUMMARY OF THE DISCLOSURE

A novel method for forming a dual gate oxide layer is disclosed.

In accordance with an embodiment, a method for forming a dual gate oxide layer comprises: a) forming a gate oxide layer on a semiconductor substrate; and b) increasing a thickness of a part of the gate oxide layer by performing a decoupled plasma treatment.

In accordance with another embodiment, a method for producing semiconductor device comprises: the steps of: a) forming a gate oxide layer on a semiconductor substrate, wherein a cell region and a peripheral circuit region are defined on the semiconductor substrate; b) performing a decoupled plasma treatment to a part of the gate oxide layer in the cell region; c) forming a gate electrode on each gate oxide layer of the cell region and peripheral circuit region; and d) forming a source/drain region on the semiconductor substrate of the gate electrode.

BRIEF DESCRIPTION OF THE DRAWINGS

The above and other features of the disclosed methods will become apparent from the following description of preferred embodiments taken in conjunction with the accompanying drawings, wherein.

DETAILED DESCRIPTION OF THE PRESENTLY PREFERRED EMBODIMENTS

Hereinafter, a novel method for fabricating semiconductor device having dual gate oxide layer will be described in detail referring to the accompanying drawings.

Figure 1A:
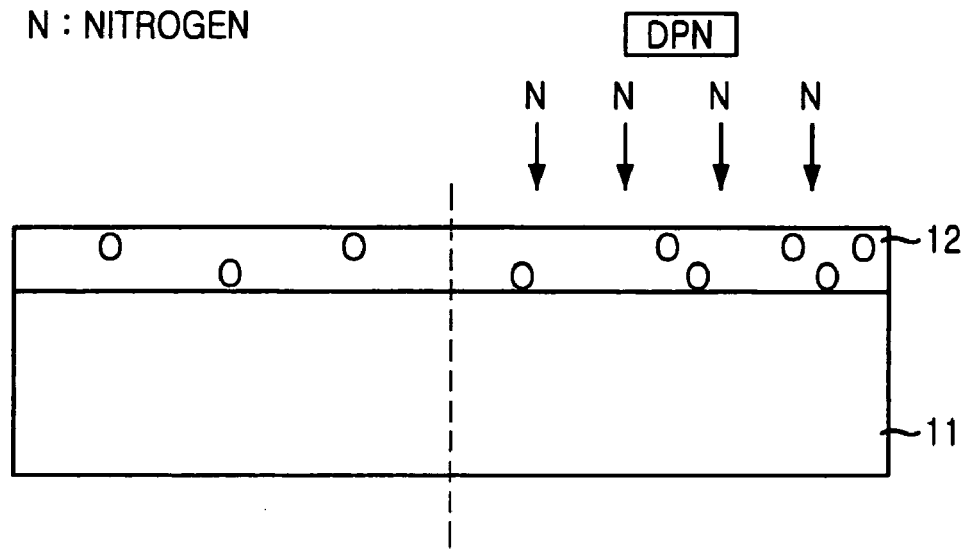
FIGS. 1A and 1B are cross-sectional views illustrating a method for forming a dual gate oxide layer.
Figure 1B:
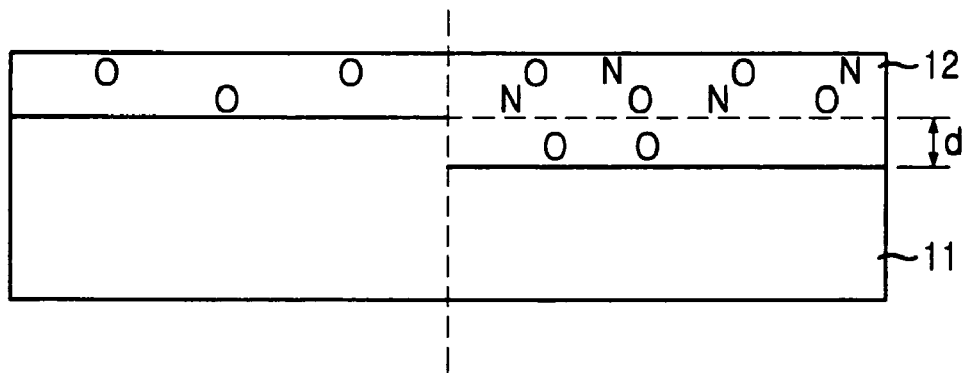

FIGS. 1A and 1B are cross-sectional view illustrating a method for forming a dual gate oxide layer. A decoupled plasma device is used to form a dual gate oxide layer. Normal plasma etch tools use a single power, referred to as a source power, with the wafers electrically grounded; alternately, the wafers may be attached to the source power, and the chamber is electrically grounded. The plasma etch tool controls the source power and affects how much plasma is generated, and also controls the concentration of reactive species, and hence how the reactive species lands on the wafer.

In the decoupled plasma source etcher, the power is separated into a source power, which is a high power supplied to the chamber wall. Another power is connected to the wafer, referred to as bias power, or bottom power. The source power ionizes the gas supplied into the chamber, and generates the reactive species in the chamber. The bias power on the wafer drives the reactive species to accelerate the reactions. Hence, there is more control of the etching process: the source power controls generation of the chemical species and therefore controls the chemical etch portion, and the bias power controls the physical part of the etch, for example the bombardment of the species onto the wafer.

Referring to FIG. 1A, a silicon oxide layer 12 is formed on a silicon substrate 11 and a part of the silicon oxide layer 12 is undergone a decoupled plasma treatment with nitrogen, hereinafter referred to as a DPN. At this point, a mask can be formed on the silicon oxide layer 12 with a photoresist in order to expose a part of the silicon oxide layer 12.

In the DPN, the silicon substrate 11 is maintained at a temperature ranging from about 0° C. to about 500° C. at a pressure ranging from about 10 mtorr to about 30 mtorr and at a flow rate ranging from about 10 sccm to about 500 sccm of a $N_2$ gas is injected. After injecting $N_2$ gas, from about 100 W to about 1000 W of RF source power is applied for a time period ranging from about 5 seconds to about 300 seconds.

However, $N_2$ can be replaced with a gas including N element such as $NH_3$, $N_2O$ and NO, a gas including halogen element such as $Cl_2$, $BCl_3$, $CF_4$, $CHF_3$, $C_2F_6$, $BF_2$, $F_2$, $NF_3$, $SF_6$, HBr, $Br_2$ and $I_2$, a gas including O element such as $O_2$, $O_3$ and $H_2O$ or a combination of these elements.

If the fluoric element series in these elements is used in the DPN, the improvement of integrity of the gate oxide layer and the characteristic of hot carriers can be additionally expected.

After the DPN, the silicon oxide layer 12 is heated to a temperature ranging from about 100° C. to about 900° C. for a time period ranging from about 1 minute to about 30 minutes in an ambient atmosphere of $N_2$, Ar or in a vacuum.

Referring to FIG. 1B, the thickness of a part of the silicon oxide layer 12, wherein the DPN is processed, is increased so as d to the thickness of the initial silicon oxide layer 12.

The reason for the thickness increment is that nitrogen N is diffused into the silicon oxide layer 12 in the DPN, so that nitrogen N is combined with a weak bond and a dangling bond in the silicon oxide layer 12 having O—Si—O bond.

That is, the weak Si—O bond is broken by nitrogen N to displace oxygen, therefore, the free-oxygen is diffused into the surface of the silicon substrate 11 and the silicon oxide layer 12. After that, additional oxidation is occurred so that the thickness of the silicon oxide layer is increased.

According to FIGS. 1A and 1B, the enough thickness of the gate oxide layer can be ensured although the high voltage is applied. Furthermore, the loss of the semiconductor substrate can be reduced because the gate oxide layer is formed neither by heat processing to the semiconductor nor ion implanting nitrogen.

FIGS. 2A through 2D are cross-section diagrams showing a method for forming a semiconductor device, in accordance with another embodiment.

Figure 2A:
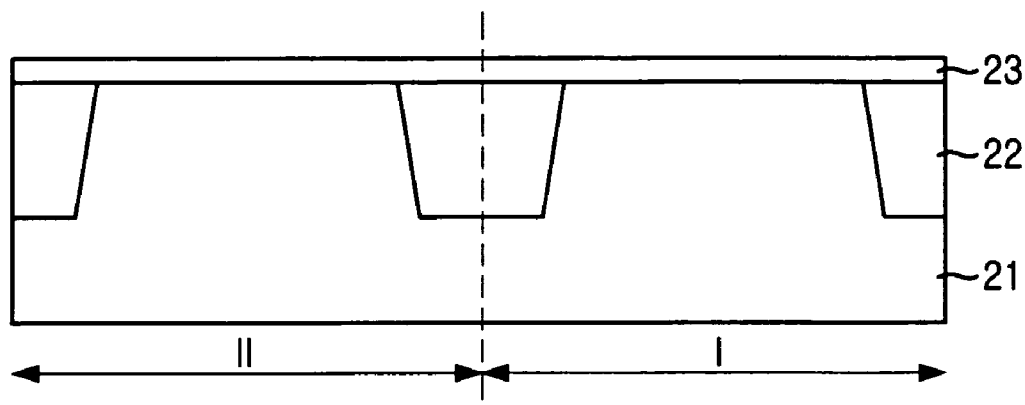
FIG. 2A through 2D are cross-sectional views illustrating a method for forming a semiconductor device.

Referring to FIG. 2A, a field oxide layer 22, which separates an active region and a field region of the device, is formed on a semiconductor substrate 21, where a cell region I and a peripheral circuit region II are defined. To form the field oxide layer 22, the semiconductor substrate 21 is etched to form a trench. After that, an oxide layer is formed in the trench to form the field oxide layer 22. This is called shallow trench isolation STI method for forming the field oxide layer 22. However, local oxidation of silicon LOCOS method can be used to form the field oxide layer 22.

A first thin silicon oxide layer $SiO_2$ 23 is grown on the active region of the semiconductor substrate 21 to form the gate oxide layer. Instead of the first silicon oxide layer 23, other layers can be used such as a silicon oxynitride layer SiON, a high oxide metal oxide layer $Al_2O_3$, $Ta_2O_5$, $HfO_2$ or $ZrO_2$, a mixture layer of high oxide metal oxide layer and silicate Hf-silicate or Zr-silicate of high oxide metal oxide layer and a high oxide layer having a nano-laminate structure of the high oxide metal oxide layer. Such gate oxide layers is formed at a thickness ranging from about 5x to about 100 x.

Figure 2B:
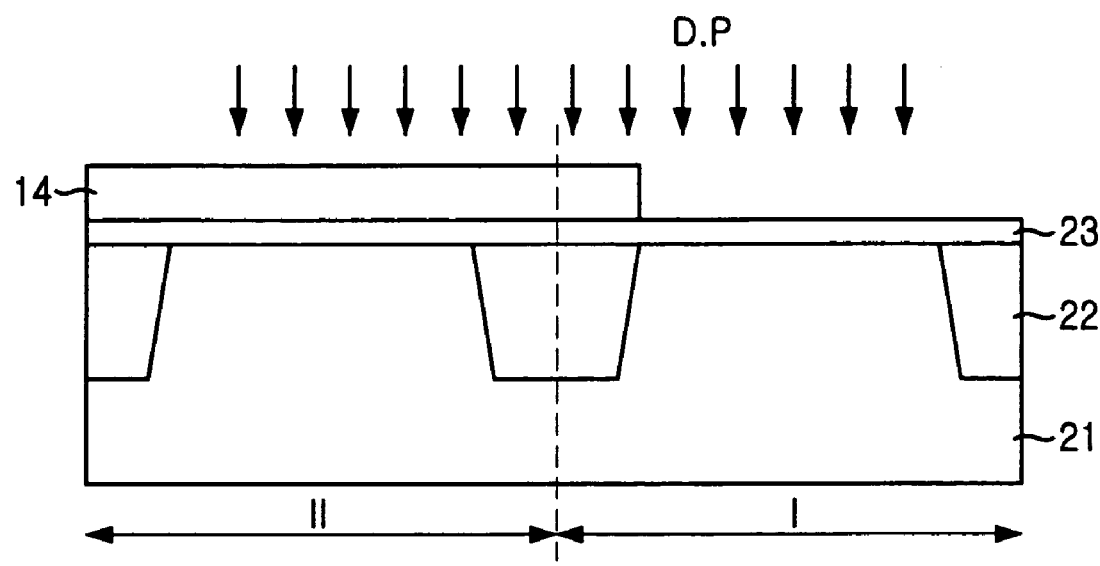

In FIG. 2B, a photoresist is coated on the semiconductor substrate 21 having the first silicon oxide layer 23. After that, a first photoresist pattern 14 is formed to expose the cell region I.

Using the first photoresist pattern 14 as a mask, the DPN is applied to the first silicon oxide layer 23 in the cell region I.

At this time, the silicon substrate 14 is maintained at a temperature ranging from about 0° C. to about 500° C. at a pressure ranging from about 10 mtorr to about 30 mtorr, and at a flow rate ranging from about 10 sccm to about 500 sccm of a $N_2$ gas is injected. After injecting the $N_2$ gas RF source power ranging from about 100 W to about 1000 W is applied a time period ranging from about 5 seconds to about 300 seconds.

However, $N_2$ can be replaced with a gas including N element such as $NH_3$, $N_2O$ and NO, a gas including halogen element such as $Cl_2$, $BCl_3$, $CF_4$, $CHF_3$, $C_2F_6$, $BF_2$, $F_2$, $NF_3$, $SF_6$, HBr, $Br_2$ and $I_2$, and a gas including O element such as $O_2$, $O_3$ and $H_2O$ or a combination of these elements.

If the fluoric element series in these elements is used with the DPN, the improvement of integrity of the gate oxide layer and the characteristic of hot carriers can be additionally expected.

After performing the DPN, the first silicon oxide layer 23 is heated to a temperature ranging from about 100° C. to about 900° C. for a time period ranging from about 1 minute to about 30 minutes in an ambient of $N_2$, Ar or in vacuum.

Figure 2C:
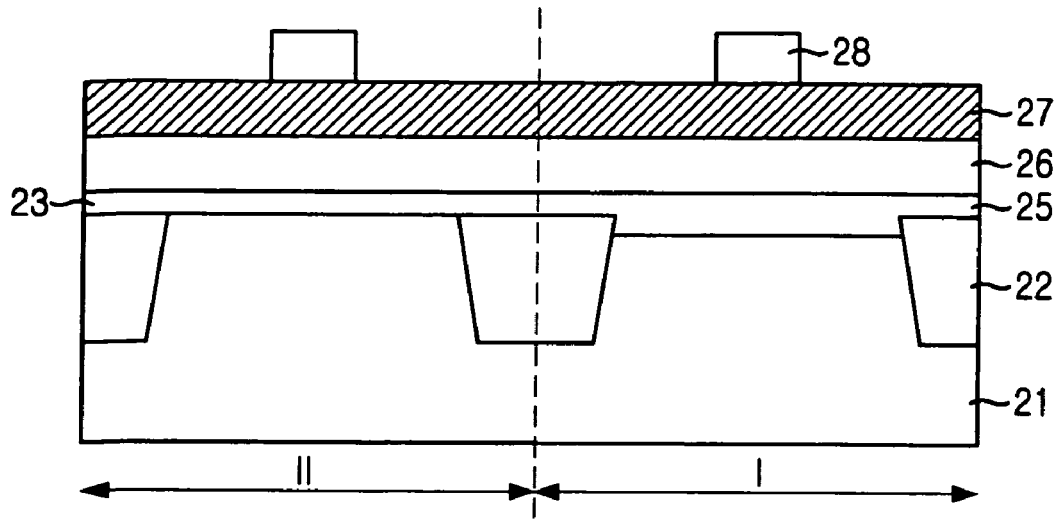

Referring to FIG. 2C, the thickness of the first silicon oxide layer 23 is increased after the DCP and it is called a second silicon oxide layer 25.

The reason of the thickness increment is that nitrogen N is diffused into the first silicon oxide layer 23 in the DPN, so that nitrogen N is combined with a weak bond and a dangling bond in the silicon oxide layer having O—Si—O bond. That is, the weak Si—O bond is broken by nitrogen N to displace oxygen, therefore, the free-oxygen is diffused into the surface of the silicon substrate 21 and the first silicon oxide layer 23. After that, additional oxidation is occurred so that the thickness of the silicon oxide layer is increased.

After forming the second silicon oxide layer 25, the first photoresist pattern 14 on the semiconductor substrate 21 is removed. A doped poly silicon 26 and a low resistance metal layer 27 are stacked in sequence to have a total thickness ranging from about 50x to about 2000x in order to form a gate electrode.

At this time, a metal layer, where nitride metal and nitride metal/silicide are stacked respectively in sequence, is used for the low resistance metal layer 27.

Furthermore, a n+ poly silicon, having a work function ranging from about 4.1 eV to about 4.2 eV is used for the doped poly silicon 26. For nitride metal of the low resistance metal layer 27, TiN, TaN, WN, TiSiN, TiAlN, TiBN, ZrSiN, ZrAlN, MoSiN, MoAlN, RuTiN, RuTaN, IrTiN, TaSiN or TaAlN is used. For silicide element, Wsi, CoSi, CoSi, TiSi, MoSi, TaSi or NbSi is used.

However, the thickness of the poly silicon and nitride metal ranging from about 10x to about 2000x. A stacked layer, wherein silicide is stacked, is used to reduce the resistance of the gate electrode and the thickness of silicide ranging from about 50x to about 2000x.

Next, the photoresist is coated on the low resistance metal layer 27 and a second photoresist pattern 28 is formed.

Figure 2D:
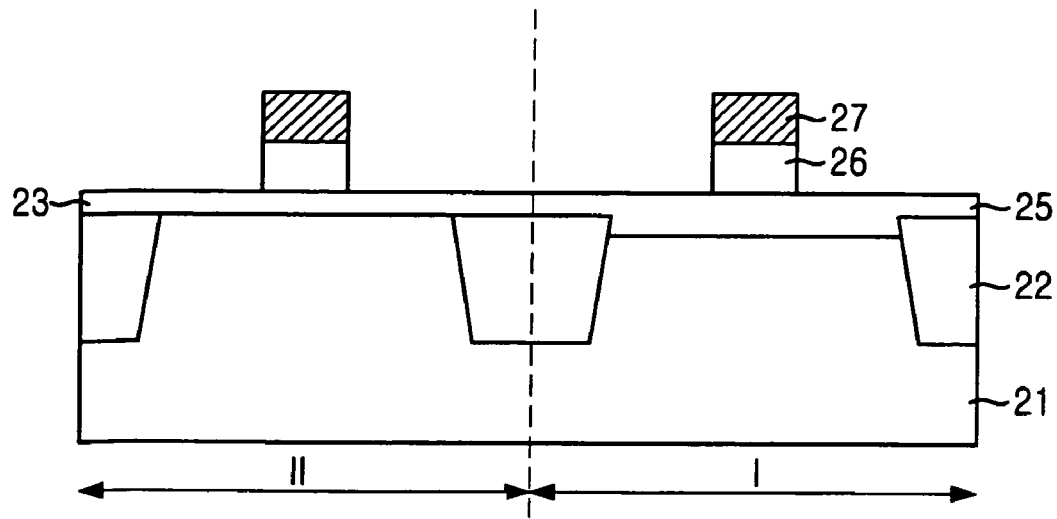

Referring to FIG. 2D, the low resistance metal layer 27 and the doped poly silicon 26 are etched as by using the second photoresist pattern 28 as an etching masks so that the gate electrodes of each transistor is formed in the cell region I and the peripheral circuit region II.

After removing the second photoresist pattern 28, a source/drain, having a LDD structure, is formed through a spacer formation and an impurity injection processes. An oxide layer is formed to insulate each transistor and a metallization process is performed for connecting source, drain and gate electrodes to external devices.

If the DPN is performed only in the cell region I in order to form the dual gate oxide, the gate oxide layer in the cell region I can be formed with a thickness greater than the gate oxide layer in the peripheral circuit region II by as much as about 2x to about 10x.

Therefore, the enough thickness of the gate oxide layer can be obtained although the high voltage is applied. Also, the transistor formed on the gate oxide layer undergone the DPN in the cell region I has higher threshold voltage Vt ranging from about +0.4 V to about +0.5 V than the transistor in the peripheral circuit region II. The threshold voltage Vt can be adjusted by applying an implant process to the cell.

Figure 3:
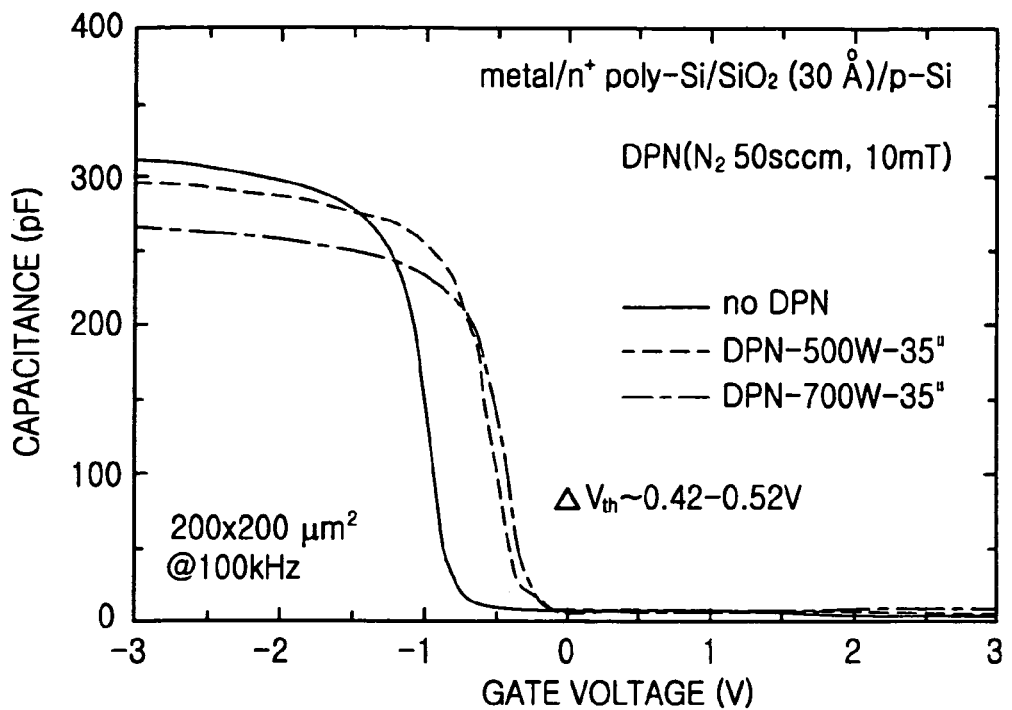
FIG. 3 is a graph of a C-V characteristic curve for a MOS capacitor undergone the DPN processed on the silicon oxide layer.

FIG. 3 is a graph of a C-V characteristic curve for a MOS capacitor undergone the DPN processed on the silicon oxide layer, in accordance with the other embodiment of the present invention. In FIG. 3, if the DPN is processed, the threshold voltage Vt is increased to a range of from about +0.4 V to about +0.5 V compared with MOS transistors formed on non-DPN processed silicon oxide layer.

Accordingly, the excess channel ion implantation can be avoided, by the present invention.

Figure 4:
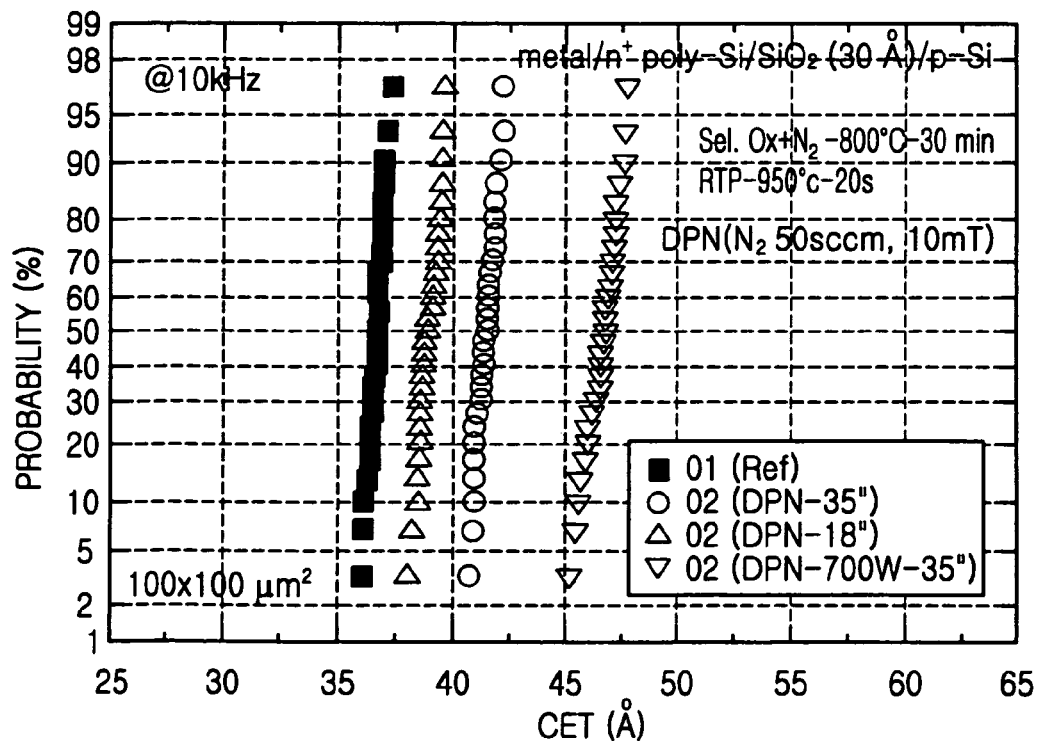
FIG. 4 is a statistical data distribution chart for a MOS capacitor undergone the DPN processed on the silicon oxide layer.

FIG. 4 is a statistical data distribution chart for a MOS capacitor undergone the DPN processed on the silicon oxide layer, in accordance with the other embodiment of the present invention. In FIG. 4, if the DPN is processed, the electrical thickness is increased depending on a process time and a source plasma power.

Referring to FIG. 4, the electrical thickness, hereinafter referred as CET, is increased as much as 2× in case of 500 W-18 seconds process, compared with the case that the DPN is not processed. In case of 500 W-35 seconds process, the CET is increased as much as 5× and in case of 700 W-35 second process, the CET is increased as 10×.

Figure 5:
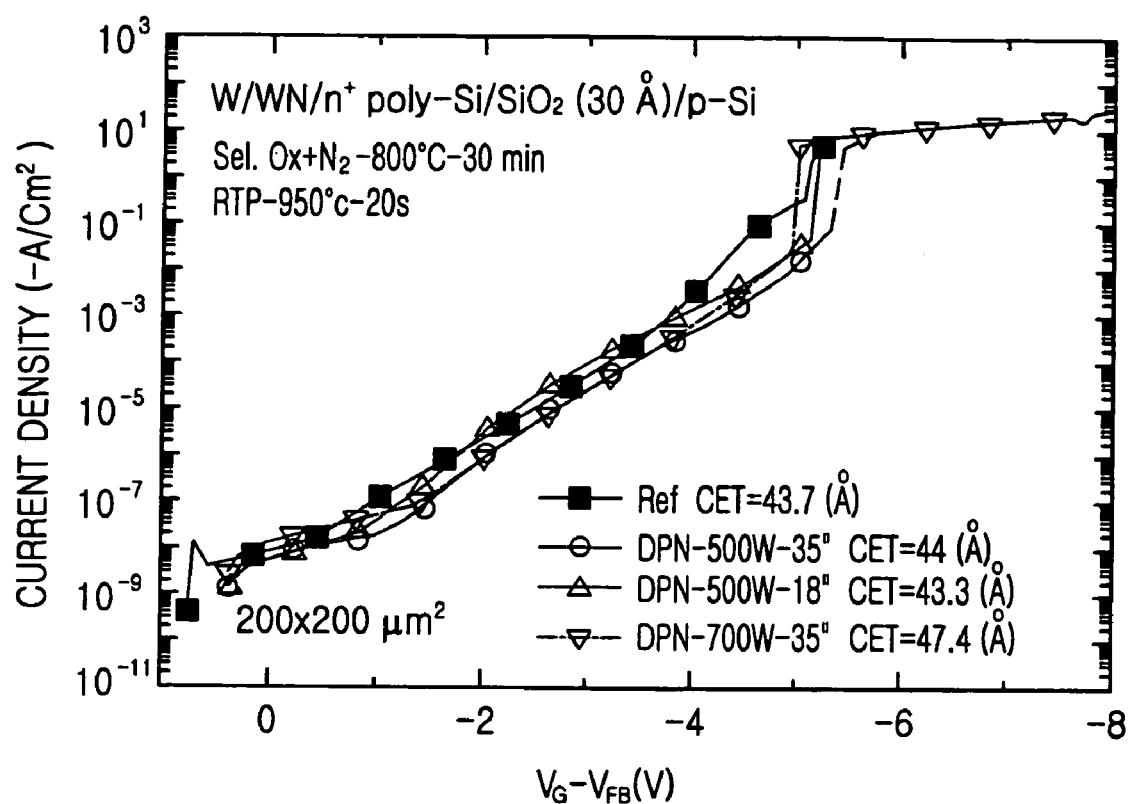
FIG. 5 is a graph of a gate leakage current characteristic curve for a MOS capacitor of the decoupled plasma treatment with nitrogen processed on the silicon oxide layer.

FIG. 5 is a graph of a gate leakage current characteristic curve for a MOS capacitor of the decoupled plasma treatment with nitrogen processed on the silicon oxide layer, in accordance with the other embodiment of the present invention. In FIG. 5, the leakage current deterioration is not found whether it is the DPN processed or not although the electrical thickness is increased.

The above methods can be applied not only to the CMOS device having the dual gate oxide layer of stacked structure but also to the CMOS device having a dual damascene structure. Furthermore, the above methods can be applied to the semiconductor device having a triple gate oxide layer.

An additional heat process is not necessary because the dual gate oxide layer is formed with the decoupled plasma. Also, the channel characteristic of the semiconductor device can be ensured because the silicon substrate is not damaged. Furthermore, because the threshold voltage in the cell region is increased without additional channel ion implantation, the electrical characteristic of the semiconductor device can be enhanced.

While the present invention has been described with respect to the particular embodiments, it will be apparent to those skilled in the art that various changes and modifications may be made without departing from the spirit and scope of the invention as defined in the following claims.

What is claimed is:

1. A method for fabricating semiconductor device comprising the steps of: a) forming a gate oxide layer on a semiconductor substrate that comprises a cell region and a peripheral circuit; b) performing a decoupled plasma treatment on the gate oxide layer in the cell region to increase a thickness of the gate oxide layer in the cell region, wherein the decoupled plasma treatment is performed with a gas mixture comprising a nitrogen (N) element, an oxygen(O) element and a halogen element; c) forming a gate electrode on the gate oxide layer of the cell region and a gate electrode on the gate oxide layer of the peripheral circuit region; and d) forming a source/drain region on the semiconductor substrate.

2. The method as recited in claim 1, wherein the step of processing the decoupled plasma treatment comprises:
   a) forming a photoresist on the gate oxide layer;
   b) forming a mask pattern to expose the gate oxide layer in the cell region by patterning the photoresist; and
   c) performing the decoupled plasma treatment using the mask pattern as an oxidation mask.

3. The method as recited in claim 2, wherein the decoupled plasma treatment is performed on the semiconductor substrate at a temperature ranging from about 0° C. to about 500° C., at a pressure ranging from about 10 mtorr to about 30 mtorr, in an ambient of $N_2$ gas, at an RF source power ranging from about 100 W to about 1000 W and for a time period ranging from about 5 seconds to about 300 seconds.

4. The method as recited in claim 1, wherein the gas comprising halogen element is a material selected from the group consisting of $Cl_2$, $BCl_3$, $CF_4$, $CHF_3$, $C_2F_6$, $BF_2$, $F_2$, $NF_3$, $SF_6$, HBr, $Br_2$ and $I_2$.

* * * * *